United States Patent

[15] 3,670,182

[45] June 13, 1972

Konno et al.

[54] HIGH-SPEED PULSE DELAYING CIRCUIT

[72] Inventors: Tsuyoshi Konno; Katsuo Nakazato; Satoshi Ise, all of Kodoma, Japan

[73] Assignee: Matsushita Electric Industrial Company, Limited, Osaka, Japan

[22] Filed: Sept. 17, 1970

[21] Appl. No.: 72,981

[30] Foreign Application Priority Data

Sept. 17, 1969 Japan....................................44/75037

[52] U.S. Cl................................307/293, 307/268, 307/270, 307/283, 307/302

[51] Int. Cl...........................................................H03k 17/26

[58] Field of Search...................307/268, 270, 283, 293, 302

[56] References Cited

UNITED STATES PATENTS

| | | | |
|---|---|---|---|
| 3,308,308 | 3/1967 | Bray | 307/283 X |
| 3,245,050 | 4/1966 | McGrogan, Jr. | 307/283 X |
| 3,289,119 | 11/1966 | Josephs | 307/302 X |
| 3,315,097 | 4/1967 | Kanai et al. | 307/283 |
| 3,553,605 | 1/1971 | Brock et al | 307/283 X |

OTHER PUBLICATIONS

Henebry, " Avalanche Transistor Circuits," The Review of Scientific Instruments, Vol. 32, No. 11, Nov. 1963 (pp. 1198–1203)

*Primary Examiner*—Donald D. Forrer
*Assistant Examiner*—R. C. Woodbridge
*Attorney*—McCarthy, Depaoli, O'Brien & Price

[57] ABSTRACT

This specification discloses a high-speed pulse delaying circuit having its extremely slight minimal delay and adapted for use as a time-base circuit for a wideband oscilloscope. The pulse delay circuit comprises essentially an integrator consisting of a resistor, a capacitor and a grounded resistor connected to the capacitor in series and a high-speed pulse generator using an avalanche transistor. The grounded resistor has such a low resistance that the waveform of the integrator output resulting from the integration of a rectangular input pulse has a sharp rising portion at a position corresponding to the leading edge of the rectangular pulse, thereby to reduce the minimal delay time. Provision of a voltage adjustment circuit is made for varying the emitter potential of the avalanche transistor to vary the delay time.

2 Claims, 2 Drawing Figures

INVENTORS
TSUYOSHI KONNO
KATSUO NAKAZATO
SATOSHI ISE
BY McCarthy, Depaoli & O'Brien
ATTORNEYS

HIGH-SPEED PULSE DELAYING CIRCUIT

This invention relates to pulse processing techniques and more particularly to a high-speed pulse delaying circuit having an extremely slight minimal delay and in which adjustment of a delay time can be easily made.

Heretofore, it has been customary to employ a relaxation oscillator as a pulse delay circuit. However, because of its low limit of response speed, a minimal delay available by adjustment is as large as hundreds of nanoseconds. This prevents use of the oscillator of the above type as a time-base circuit for a wide-band oscilloscope which requires an extremely slight delay.

It is therefore an object of this invention to provide a new and improved high-speed pulse delaying circuit to overcome the above-stated disadvantages.

It is another object of this invention to provide a high-speed pulse delaying circuit having an extremely slight minimal delay of the order of 10's of nanoseconds, which makes possible the application of the circuit as a time-base circuit for a wide-band oscilloscope.

It is a further object of this invention to provide a high-speed pulse delaying circuit in which the delay time is variable by mere adjustment of the emitter potential of an avalanche transistor.

It is yet a further object of this invention to provide a high-speed pulse delaying circuit which provides for power amplification.

Figure 1:
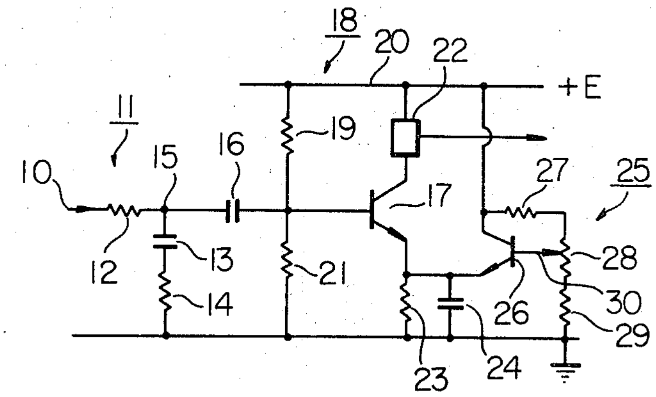
Figure 2:
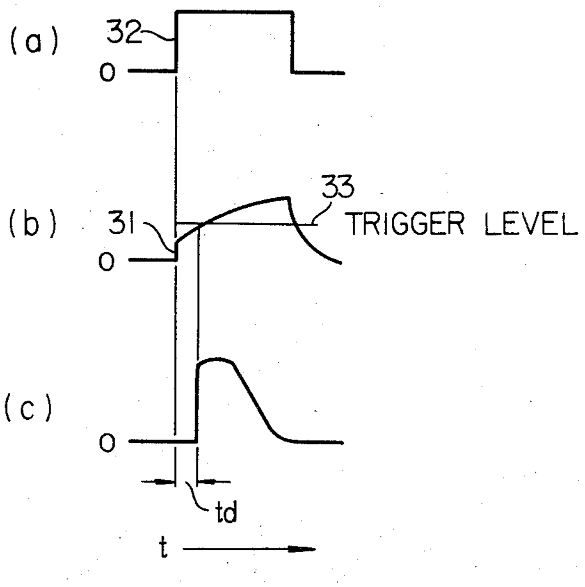

These and other objects of this invention will be apparent from the following description when taken in conjunction with the accompanying drawing, in which:

FIG. 1 is a circuit diagram of a high-speed pulse generator to one embodiment of this invention; and FIGS. 2 (*a*) through (*c*) illustrate the waveforms appearing at various points of the generator shown in FIG. 1.

Referring now to FIG. 1, there is shown a circuit diagram of a pulse delaying circuit according to one embodiment of this invention. In the figure, reference numeral 10 designates an input terminal to which is applied a triggering signal as shown in FIG. 2(*a*). The input terminal 10 is connected to an integrating circuit 11 comprising a resistor 12, a capacitor 13 and a resistor 14. The junction 15 between the resistor 12 and capacitor 13 is connected through a coupling capacitor 16 to the base of a transistor 17 which forms part of a high-speed avalanche pulse generator 18. The transistor 17 is an NPN type avalanche transistor. The base of the transistor 17 is connected through a resistor 19 to a bus line 20, and is also grounded through a resistor 21. The function of these resistors 19 and 21 is to establish the proper operating bias for the transistor 17. The transistor 17 has its collector connected through an impedance element 22 to the bus line 20 which is impressed with a positive d.c. power +E, and its emitter grounded through a parallel combination of a resistor 23 and a capacitor 24. The impedance element 22 may be a pulse transformer which provides an output voltage of any polarity or a resistor of low value, for example, several hundred ohms. The resistor 23 serves to provide an emitter bias for the transistor 17.

Connected to the emitter of the transistor 17 is a voltage adjustment circuit 25 comprising a transistor 26 of NPN type the emitter of which is connected to the emitter of the transistor 17 and the collector of which is connected to the bus line 20. The collector of the transistor 26 is connected through a resistor 27 to a potentiometer 28 which in turn is connected through a resistor 29 to ground. The slide member 30 of the potentiometer 28 is connected to the base of the transistor 26. The transistors 17 and 26 may be of PNP type, where the delaying circuit is impressed with a negative power.

Operation of the pulse delay circuit is as follows:

A triggering signal in the form of rectangular pulse as shown in FIG. 2(*a*) is applied to the input terminal 10 of the circuit and thence to the integrating circuit 11. The pulse width of the triggering signal is so selected as to be substantially equal to a maximum delay time required. The resistor 14 has such a low resistance, for example, several percent of the value of the resistor 12 that, as shown in FIG. 2(*b*), the waveform appearing at the junction 15 between the resistor 12 and the capacitor 13 has a sharp rising portion, as indicated at 31, at a position corresponding to the leading edge 32 of the rectangular pulse. This serves to reduce the minimal delay available by adjustment.

The output of the integrating circuit 11 is applied through the coupling capacitor 16 to the base of the transistor 17. The transistor 17 is normally non-conducting. When, as shown in FIG. 2(*b*), the output voltage of the integrating circuit 11 exceeds a trigger level 33 in which the transistor 17 is rendered for avalanche breakdown, there occurs an abrupt increase in the collector current, so that the impedance element 22 provides a high-speed, large-amplitude output pulse, as shown in FIG. 2(*c*). The output pulse is delayed by a time $t_d$ with respect to the rectangular input pulse, the time $t_d$ being dependent upon the trigger level.

Adjustment of the delay time $t_d$ is possible by varying the emitter voltage of the transistor 17 to raise or lower the trigger level, thereby varying the timing at which the transistor 17 is rendered for avalanche breakdown. That is, when the slide member 30 of the potentiometer 28 is moved so as to vary the base bias of the transistor 26, the emitter current flowing through the resistor 23 varies accordingly, so that the potential at the emitter of the transistor 17 varies with the resultant change in the trigger level. As will be seen, control of the delay time $t_d$ can be easily made only by adjusting the trigger level of the avalanche transistor 17.

As has been described above, this invention provides a new and improved pulse delay circuit which is capable of producing an output pulse with an extremely slight minimal delay.

What is claimed is:

1. A high-speed pulse delaying circuit comprising: an integrator including a resistor connected to the input terminal of the delaying circuit and a series combination of a capacitor and a grounded resistor having a resistance of several percent of that of the resistor connected to the input terminal of the delaying circuit so that the wavefore of the integrator output resulting from the integration of a rectangular pulse has a sharp rising portion at a position corresponding to the leading edge of the rectangular pulse; and a high-speed pulse generator using an avalanche transistor, the input of said pulse generator being connected to the input terminal and said capacitor.

2. A high-speed pulse delaying circuit according to claim 1, further comprising a voltage adjustment circuit having a transistor and a variable resistor for adjusting the potential at the emitter of said avalanche transistor to vary the delay time of said delaying circuit.

* * * * *